(12) United States Patent
Takahashi et al.

(10) Patent No.: US 6,818,387 B2
(45) Date of Patent: Nov. 16, 2004

(54) METHOD OF FORMING A PATTERN

(75) Inventors: Riichiro Takahashi, Yokohama (JP);
Kei Hayasaki, Kamakura (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 10/075,619

(22) Filed: Feb. 15, 2002

(65) Prior Publication Data

US 2002/0155391 A1 Oct. 24, 2002

(30) Foreign Application Priority Data

Feb. 16, 2001 (JP) ........................................ 2000-040618

(51) Int. Cl.⁷ ................................................ G03F 7/26
(52) U.S. Cl. ....................................... 430/322; 430/331
(58) Field of Search ................................ 430/322, 324, 430/325, 331

(56) References Cited

U.S. PATENT DOCUMENTS 5,464,480 A    11/1995   Matthews ................... 134/1.3

2002/0123011 A1  *  9/2002  Kawano et al. ............. 430/330

FOREIGN PATENT DOCUMENTS

| JP | 2-275618 | 11/1990 |
|---|---|---|
| JP | 8-213359 | 8/1996 |
| JP | 9-106081 | 4/1997 |
| JP | 11-288877 | 10/1999 |
| JP | 2000-125535 | 4/2000 |
| JP | 2000-241990 | 9/2000 |

* cited by examiner

*Primary Examiner*—Kathleen Duda
(74) *Attorney, Agent, or Firm*—Finnegan, Henderson, Farabow, Garrett & Dunner, L.L.P.

(57) ABSTRACT

There is disclosed, as an aspect, a method of forming a pattern which comprising coating a photosensitive resist film on a surface of substrate, subjecting the photosensitive resist film to an exposure process, coating an oxidizing liquid having an oxidative effect on a surface of the photosensitive resist film that has been subjected to the exposure process to thereby perform a pretreatment wherein the surface of the resist film is caused to oxidize by the oxidizing liquid to form an oxide layer thereon, feeding a developing solution to the photosensitive resist film whose surface has been oxidized to thereby perform a development of the resist film, and feeding a rinsing solution to a surface of the substrate to wash the substrate.

15 Claims, 9 Drawing Sheets

METHOD OF FORMING A PATTERN

CROSS-REFERENCE TO RELATED APPLICATIONS

This application is based upon and claims the benefit of priority from the prior Japanese Patent Application No. 2001-040618, filed Feb. 16, 2001, the entire contents of which are incorporated herein by reference.

BACKGROUND OF THE INVENTION

1. Field of the Invention

This invention relates to a method of forming a pattern, which is designed to be employed in the manufacture of a semiconductor device, a ULSI, an electronic circuit component, a liquid crystal display element, etc.

2. Description of the Related Art

Concomitant with an increasing fineness in dimension of semiconductor element and also with an increasing size in diameter of semiconductor substrate, the problems resulting from the conventional developing method, such as the generation of critical defects in a developed pattern, and the non-uniformity in dimension of pattern within the surface of a single semiconductor substrate of a single chip have become increasingly serious. In order to overcome these problems, various measures have been conventionally taken, such as the controlling of developing time, the improvement of developing solution, the employment of chemicals as a rinsing liquid, the extension of rinsing time, an increased repetition of rinsing, etc., which however inevitably invite the complication of pattern-forming process. Therefore, it is now desired to find out a novel method which is simpler in process and more effective.

According to the prior art, the developing step of semiconductor substrate after the processes of exposure and heat treatment has been generally performed by a method wherein a developing solution is directly ejected to the surface of semiconductor substrate to be treated to thereby initiate the development thereof. There is also known a developing process including a pretreatment wherein pure water is ejected to the surface of semiconductor substrate, after which the pure water remaining on the surface of the semiconductor substrate is shaken off by rotating the semiconductor substrate at a low speed so as to form a thin water layer on the surface of the semiconductor substrate, thus preliminarily wetting the semiconductor substrate and apparently improving the wettability of the surface of the semiconductor substrate to a developing solution. After this pretreatment, a developing solution is ejected to the surface of the semiconductor substrate to thereby perform the development.

Since a semiconductor substrate is enabled to wet by means of the pretreatment using pure water (hereinafter referred to as the pure water pretreatment), the developing solution can be prevented more or less from being repelled out of the surface of the semiconductor substrate, thereby making it possible to improve the in-plane uniformity of the layer of the developing solution. However, due to the demand for further enhancing the fineness of critical dimension, the problem of difference in dimension within a minute region that cannot be overcome by the conventional method is now raised, thereby necessitating the development of more precise developing process. Furthermore, concomitant with the enhancing fineness of critical dimension, the defects of pattern due to the conventional developing process are caused to frequently generate, thus raising a serious problem that the yield of semiconductor device is deteriorated. It is impossible, with the employment of the conventional developing process, to overcome these problems. It is also ineffective, even with the aforementioned pure water pretreatment, to overcome these problems.

As described above, concomitant with an increasing fineness in dimension of semiconductor element and also with an increasing size in diameter of semiconductor substrate, the non-uniformity in dimension of pattern within a minute region of the semiconductor substrate as well as all over the surface of the semiconductor substrate is caused to generate, thereby necessitating the development of more precise developing process. Additionally, it is also required to minimize the generation of critical defects in a developed pattern, that may be resulted from a developing process.

BRIEF SUMMARY OF THE INVENTION (1) According to an aspect of the present invention, there is provided a method of forming a pattern:

coating a photosensitive resist film on a surface of substrate;

subjecting the photosensitive resist film to an exposure process;

coating an oxidizing liquid having an oxidative effect on a surface of the photosensitive resist film that has been subjected to the exposure process to thereby perform a pretreatment wherein the surface of the resist film is caused to oxidize by the oxidizing liquid to form an oxide layer thereon;

feeding a developing solution to the photosensitive resist film whose surface has been oxidized to thereby perform a development of the resist film; and feeding a rinsing solution to a surface of the substrate to wash the substrate.

(2) According to an aspect of the present invention, there is provided a method of disposing a chemical liquid which has been employed in a treatment of a substrate:

feeding an alkaline solution to a chemical liquid-retaining portion which is disposed outside a substrate having a thin film formed on a main surface thereof;

feeding an aqueous solution of ozone to a main surface of the substrate to thereby reform a surface of the thin film, the aqueous solution of ozone which has been employed in the reforming being subsequently introduced into the chemical liquid-retaining portion where the alkaline solution is retained;

decomposing ozone of the aqueous solution of ozone that has been introduced into the chemical liquid-retaining portion by making use of the alkaline solution retained in the chemical liquid-retaining portion; and discharging the alkaline solution and the aqueous solution of ozone where ozone has been decomposed from the chemical liquid-retaining portion.

(3) According to an aspect of the present invention, there is provided a method of forming a pattern:

feeding an alkaline solution to a chemical liquid-retaining portion which is disposed outside a substrate having a thin film formed on a main surface thereof;

feeding an aqueous solution of ozone to a main surface of the substrate to thereby reform a surface of the thin film, the aqueous solution of ozone which has been employed in the reforming being subsequently introduced into the chemical liquid-retaining portion where the alkaline solution is retained;

decomposing ozone of the aqueous solution of ozone that has been introduced into the chemical liquid-retaining portion by making use of the alkaline solution retained in the chemical liquid-retaining portion;

feeding an alkaline solution to the main surface of the substrate which has been surface-modified to thereby selectively etch the thin film by making use of the alkaline solution, the alkaline solution employed in the etching being subsequently retained in the chemical liquid-retaining portion; and discharging the alkaline solution and the aqueous solution of ozone where ozone has been decomposed from the chemical liquid-retaining portion.

(4) According to an aspect of the present invention, there is provided a method of forming a pattern:

feeding an alkaline solution to a main surface of a substrate having a thin film formed on a main surface thereof to thereby selectively etch the thin film by making use of the alkaline solution;

retaining the alkaline solution which has been employed for the etching in a chemical liquid-retaining portion disposed outside the substrate;

feeding an aqueous solution of ozone to a main surface of the substrate which has been etched to thereby wash the main surface of the substrate, the aqueous solution of ozone which has been employed in the washing being subsequently introduced into the chemical liquid-retaining portion;

decomposing ozone of the aqueous solution of ozone that has been introduced into the chemical liquid-retaining portion by making use of the alkaline solution retained in the chemical liquid-retaining portion;

drying the substrate which has been washed; and discharging the alkaline solution and the aqueous solution of ozone where ozone has been decomposed from the chemical liquid-retaining portion.

(5) According to an aspect of the present invention, there is provided a method of forming a pattern:

feeding an alkaline solution to a chemical liquid-retaining portion which is disposed outside a substrate having a thin film formed on a main surface thereof;

feeding an aqueous solution of ozone to a main surface of the substrate to thereby reform a surface of the thin film, the aqueous solution of ozone which has been employed in the reforming being subsequently introduced into the chemical liquid-retaining portion where the alkaline solution is retained;

feeding an alkaline solution to the main surface of the substrate where the thin film has been reformed to thereby selectively etch the thin film by making use of the alkaline solution, the alkaline solution employed in the etching being subsequently retained in the chemical liquid-retaining portion;

exposing the main surface of the substrate where the thin film has been etched to the aqueous solution of ozone to thereby wash the main surface of the substrate, the aqueous solution of ozone which has been employed in the washing being subsequently introduced into the chemical liquid-retaining portion;

decomposing ozone of the aqueous solution of ozone that has been introduced into the chemical liquid-retaining portion by making use of the alkaline solution retained in the chemical liquid-retaining portion;

drying the substrate which has been dried; and discharging the alkaline solution and the aqueous solution of ozone where ozone has been decomposed from the chemical liquid-retaining portion.

DETAILED DESCRIPTION OF THE INVENTION

Various embodiments of the present invention will be further explained as follows with reference to the drawings.

(A First Embodiment)

Figure 1:
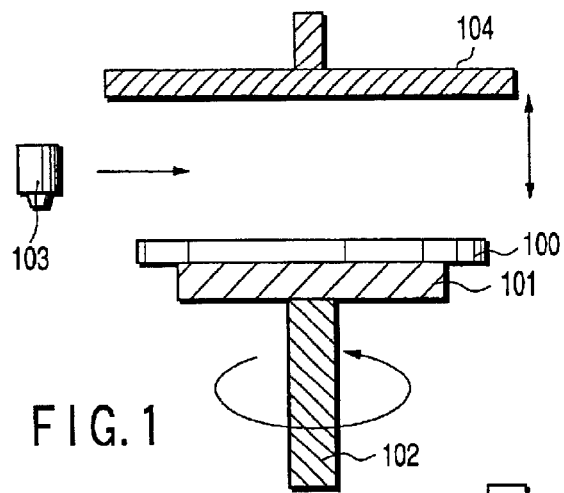
FIG. 1 schematically illustrates the general structure of a chemical liquid-coating apparatus according to a first embodiment of this invention.

First of all, a chemical liquid-coating apparatus which was employed in this embodiment will be explained. FIG. 1 illustrates the general structure of a chemical liquid-coating apparatus according to the first embodiment of this invention.

As shown in FIG. 1, an anchoring table 101 having a surface on which a substrate (a substrate to be worked) 100 is to be fastened is connected with a rotating mechanism 102 which is designed to rotate the anchoring table 101. A chemical liquid-feeding nozzle 103 is disposed over the anchoring table 101 so as to enable a chemical liquid such as an aqueous solution of ozone, a developing solution, a rinsing liquid, etc. to be ejected on the surface of the substrate 100. This chemical liquid-feeding nozzle 103 is designed to be actuated by means of a driving mechanism, thereby enabling this chemical liquid-feeding nozzle 103 to move relative to the substrate 100. Concomitant with this relative movement of the chemical liquid-feeding nozzle 103, a chemical liquid is permitted to be ejected on the surface of the substrate 100 to thereby coat the chemical liquid on the surface of the substrate 100.

The chemical liquid-feeding nozzle 103 is provided with a plurality of feeding ports to thereby permit an aqueous solution of ozone, a developing solution and a rinsing liquid (pure water) to be individually ejected from separate nozzles. Further, this chemical liquid-feeding nozzle 103 is actuated, on the occasion of ejecting chemical liquids, so as to be scanned unidirectionally, starting from outside the substrate, all over the surface of the substrate, thus ejecting chemical liquids.

A disk plate 104 formed of a flat rotary disc provided at the center thereof with an air inlet hole, and a lifting mechanism for this disk plate 104 are arranged over the surface of the substrate 100 as an agitating mechanism for agitating a chemical liquid which has been coated on the surface of the substrate 100.

By the way, the chemical liquid-feeding nozzle 103 may not necessarily constructed as described above, but may be constructed in any manner as long as chemical liquids can be uniformly ejected all over the surface of the substrate 100. Further, the agitating mechanism may not necessarily constructed as described above, but may be constructed in any manner as long as it is capable of agitating a developing solution during the developing process.

Next, the method of forming a pattern by making use of the aforementioned developing solution-coating apparatus will be explained with reference to FIGS. 2A through 2G.

Figure 2A:
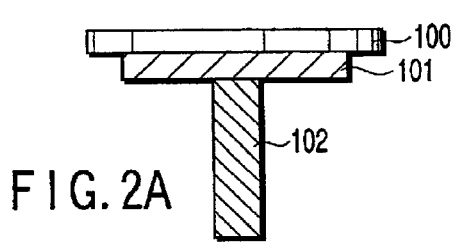
FIGS. 2A to 2G respectively shows a diagram illustrating in step-wise the process of forming a resist film where the chemical liquid-coating apparatus shown in FIG. 1 was employed.

As shown in FIG. 2A, a reflection preventive film and a chemical amplification type resist are successively coated on the surface of the substrate 100 and then, subjected to an exposure process of reduction projection wherein a desired pattern is transcribed, by making use of KrF excimer laser and through an exposure mask, to the coated layer. Thereafter, the substrate 100 is heat-treated (PEB), transferred to a developing unit, and fixed to the anchoring table 101.

Figure 2D:
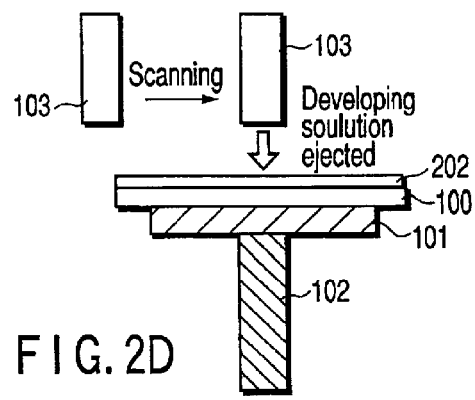
Figure 2B:
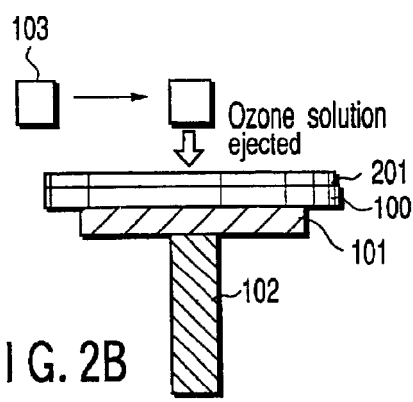

Then, as shown in FIG. 2B, an aqueous solution of ozone as low as 2 ppm in concentration of ozone is ejected from the chemical liquid-feeding nozzle 103 to thereby form an aqueous ozone solution film 201 on the surface of the substrate 100. By allowing the entire surface of the substrate 100 to be contacted with the aqueous ozone solution film 201 for 5 to 30 seconds, only the surface of the resist is permitted to be slightly oxidized, thus accomplishing the pretreatment using an aqueous solution of ozone (hereinafter referred to as the aqueous ozone solution pretreatment).

Figure 2E:
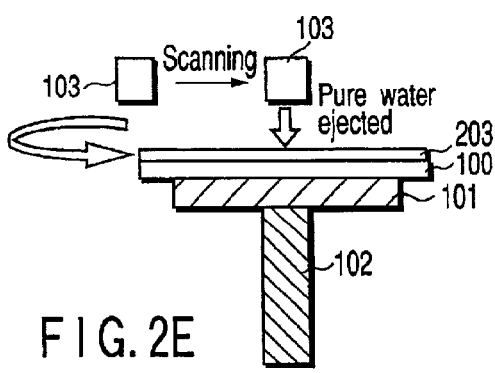
Figure 2C:
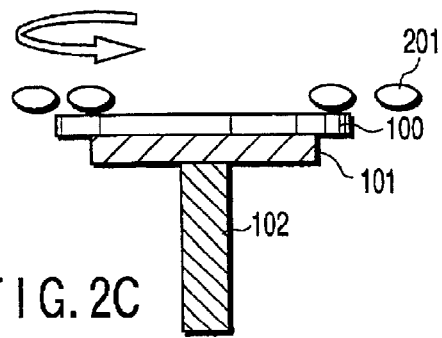

Then, as shown in FIG. 2C, the substrate 100 is rotated at a rotational speed of 2000 rpm by means of the rotating mechanism 102 to thereby remove the aqueous ozone solution film 201 formed on the surface of the substrate 100.

Thereafter, as shown in FIG. 2D, while permitting a developing solution to be ejected in a curtain-like manner from the chemical liquid-feeding nozzle 103, the chemical liquid-feeding nozzle 103 is scanned from one end of the substrate 100 to the other, thereby forming a developing solution film 202 on the surface of the substrate 100. By making use of this developing solution film 202, the development of the resist film formed on the surface of the substrate 100 is performed for 30 to 45 seconds. According to the prior art, it took 60 seconds for carrying out the development. Whereas, according to this invention, since the aqueous ozone solution pretreatment is performed as a preliminary step, it is now possible to shorten the developing time to a period of 30 to 45 seconds.

Figure 2F:
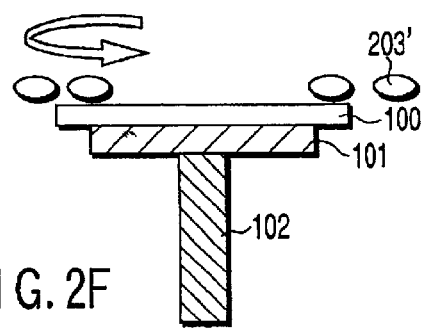
Figure 2G:
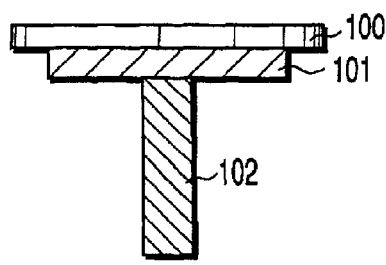

Next, as shown in FIG. 2E, after the elapse of time which is required for obtaining a desired pattern in the resist film by means of developing process, ultra-pure water is ejected from the chemical liquid-feeding nozzle 103 to the surface of the substrate 100 to thereby stop the developing process and concurrently wash away the developing solution, the dissolved products, etc. Then, after finishing a 10-second washing by making use of pure water, the pure water 203' existing on the surface of the substrate 100 is permitted to be shaken off by rotating the substrate 100 at a high rotational speed by means of the rotating mechanism 102 as shown in FIG. 2F. Then, as shown in FIG. 2G, the surface of the substrate 100 is permitted to dry, thus finishing the developing process.

As described above, the surface of the resist formed on the surface of substrate is oxidized by the aqueous ozone solution pretreatment. As a result, a large quantity of carboxylic acid is enabled to be formed on the surface of the resist, thereby enhancing the wettability of the surface of the resist to pure water as well as to the developing solution and reforming the surface of the resist into a more hydrophilic surface. The following function and effects can be obtained by the aforementioned development and washing.

First of all, the function and effects in the developing process that can be realized from the aqueous ozone solution pretreatment will be explained.

Figure 3:
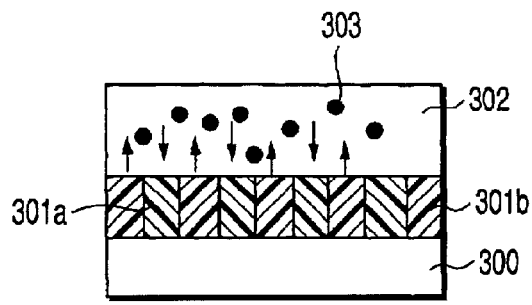
FIG. 3 shows a diagram for illustrating a developing solution and a resist film formed according to a conventional resist film-forming method.
Figure 4B:
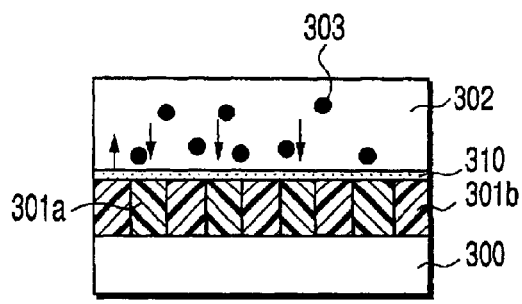

The effects of the aqueous ozone solution pretreatment on the developing solution will be more prominently recognized in a very initial stage of developing process and also in the process wherein the developing solution is contacted with the surface of the resist. When it is desired to deposit a developing solution 302 directly on the surfaces of resists 301*a* (exposure region) and 301*b* (non-exposure region) after an exposure process, alkaline ion 303 constituting the molecule of the developing solution is generally subjected to an intensive repulsive force, in particular, by the non-exposure region 301*b* due to an intermolecular interaction to be generated between the molecule of the developing solution and the molecule constituting the surface of the resist as shown in FIG. 3. As a result, the developing solution 302 is repelled from the surface of the non-exposure region 301*b* of resist, so that in the case of the exposure region 301*a* whose marginal region is constituted by a extensive non-exposure area, the time to initiate the developing process is caused to differ depending on a particular region in the entire surface of the substrate, thereby causing the developing time to scatter depending on a region in the surface of the resist.

This non-uniformity of development to be generated on the surface of the substrate gives influences to the flowing direction of the developing solution 302 after the initiation of developing process as well as to the flow rate of the developing solution 302. In this case, dissolved products to be produced in the resist during the developing process are permitted to be carried by the flow of the developing solution 302 and introduced more or less into the substrate. Due to these phenomena, the dimension of pattern obtained after the developing process is caused to become non-uniform within the surface of the substrate.

Figure 4A:
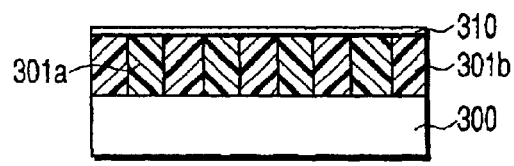
FIGS. 4A and 4B respectively shows a diagram for illustrating a developing solution and a resist film formed according to the resist film-forming method employed in a first embodiment.

It is possible, by subjecting the surface of the resist to an oxidation treatment by making use of an aqueous solution of ozone prior to the developing process, to form an oxide layer 310 on the surface of the resist 301*a* and 301*b* as shown in FIG. 4A. Since the contact angle of the developing solution 302 to the oxide layer 310 is lower than the contact angle thereof to the resist 301*a* and 301*b*, the intermolecular interaction between the molecule constituting the surface of the resist 301a and 301b and the alkaline ion 303 existing in the developing solution 302, thereby preventing the developing solution 302 from being repelled by the surface of the resist 301a and 301b immediately after the ejection of the developing solution. As a result, the non-uniformity of development as well as the scattering of developing time can be prevented.

Further, according to the conventional method, due to a prominent difference in dissolving speed of the resist into the developing solution 302 between the exposure region 301a and the non-exposure region 301b thereof, as well as due to a difference in contact angle of the developing solution 302 at the surface of the resist, a substantial resistive friction of the surface of the substrate against the flow of developing solution is caused to generate, thereby generating the scattering of the flow rate and of the flowing direction in the flow of the developing solution, and hence generating the scattering of development on the surface of the substrate. Whereas, according to this invention, since the exposure region as well as the non-exposure region are oxidized by means of the aqueous ozone solution pretreatment, a difference in contact angle between the exposure region 301a and the non-exposure region 301b can be minimized, and at the same time, the aforementioned substantial resistive friction can be minimized. As a result, the flow of the developing solution 302 can be rectified, thereby improving the uniformity in dimension of pattern within the surface of the substrate 300.

Further, according to the conventional method, in the development of a patterned region where a very fine exposure portion and a very fine non-exposure portion are densely intermingle with each other, due to the repulsive force of the molecule in the developing solution against the alkaline ion existing in the pattern of non-exposure portion neighboring the pattern of exposure portion as well as due to the attracting force by the pattern of exposure portion, the laterally flowing force to slide over a densely patterned region, rather than the force to cause the alkaline ion to move down to the pattern of exposure portion, is predominantly acted on the pattern of the exposure portion where the development is inherently proceeded rapidly. As a result, the developing solution tends to be repelled in the region of dense pattern at an initial stage of developing process, thereby preventing the penetration of the alkaline ion into the region of dense pattern, resulting in the generation of difference in dimension of densely patterned region after the developing process as compared with the patterned region where the exposure portion and the non-exposure portion are not densely intermingled.

Whereas, when an aqueous ozone solution containing a low concentration of ozone is employed in the pretreatment prior to the developing process, the surface of the resist layer formed on the substrate can be oxidized irrespective of the exposure region and the non-exposure region thereof, and the contact angle of the surface of resist with respect to the developing solution can be lowered. As a result, the repulsive force due to the intermolecular interaction by the non-exposure portion against the alkaline ion existing inside the developing solution can be weakened. Therefore, it is possible to rapidly perform the development of the exposure portion without inviting the repelling of the developing solution in the region of fine pattern where an exposure portion and a non-exposure portion are densely intermingled. As a result, it is now possible to overcome the problem of the prior art, i.e. to prevent the generation of difference in dimension between a patterned region where the exposure portion and the non-exposure portion are densely intermingled and a patterned region where the exposure portion and the non-exposure portion are not densely intermingled.

Furthermore, since the time interval between the formation of the film of a developing solution and the initiation of substantial development through the penetration of the developing solution into the surface of resist in the initial stage of development can be shortened due to the acceleration of penetration of the developing solution into the surface of resist, which has been realized by the aqueous ozone solution pretreatment, the throughput during the developing step can be enhanced.

Figure 5:
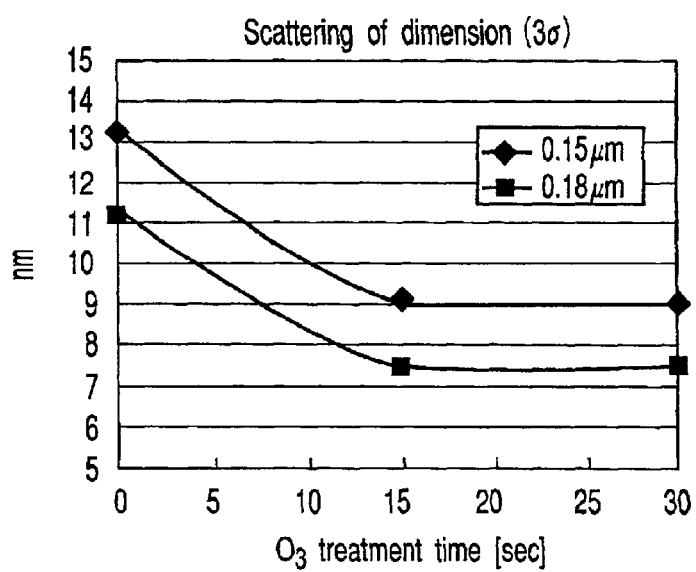
FIG. 5 shows a graph illustrating the relationship between the scattering in dimension of resist pattern within the surface of substrate and the processing time using an aqueous solution of ozone.

FIG. 5 shows the results obtained from the method of this embodiment, illustrating the relationship between the scattering in dimension of resist pattern (0.15 $\mu$mL/S, 0.18 $\mu$mL/S) within the surface of substrate and the processing time using an aqueous solution of ozone. It was found possible to clearly lower the 3$\sigma$ value by performing the aqueous ozone solution pretreatment.

Further, Table 1 shows the results indicating an improvement of in-plane uniformity when the aqueous ozone solution pretreatment was performed for 15 seconds.

TABLE 1

|  | 0.15 $\mu$mL/S in dimension 15-second $O_3$ treatment | 0.18 $\mu$mL/S in dimension 15-second $O_3$ treatment |
|---|---|---|
| 3$\sigma$/REF | 68.40% | 66.90% |

In Table 1, 3$\sigma$/REF represents the comparison between the 3$\sigma$ of the scattering in dimension of the resist formed by undergoing the aqueous ozone solution pretreatment and the 3$\sigma$ of the scattering in dimension of the resist formed according to a conventional method, the comparison being denoted by percentage.

As shown in Table 1, it was found possible, by conducting the aqueous ozone solution pretreatment, to reduce the scattering in dimension of the resist within the surface of substrate to 70% or less as compared with the resist which was formed according to the conventional method.

By the way, in the case where the oxidative effect of aqueous ozone solution is strong, not only the surface of a resist film is oxidized to form an oxide layer, but also the polymer constituting the resist film is decomposed in the oxide layer, thereby turning the oxide layer into an invasion layer. When the invasion layer (oxide layer) becomes 5 nm or more in thickness, the development may be promoted more than required on the occasion of developing process, thereby possibly deteriorating the etching resistance of oxide layer as a mask in the etching step subsequent to the developing step. Therefore, it is preferable to employ an aqueous solution of ozone 5 ppm or less in ozone concentration so as to control the thickness of the invasion layer (oxide layer) to less than 5 nm. More preferably, the invasion layer should not be formed at all.

On the other hand, it is possible, through weakening of oxidative effect of an aqueous solution of ozone, to selectively oxidize only the molecule constituting the surface layer of the resist without decomposing the resist resin by the effect of aqueous ozone solution, thereby preventing the etching resistance of resist as a mask from being badly affected in an etching step subsequent to the developing step.

Next, the function and effects in the washing process that can be realized from the aqueous ozone solution pretreatment will be explained.

According to the prior art, it is known that the organic molecule 403 that has been contained in a resist is permitted to elute into a developing solution 402 during a developing process, and that the organic molecule 403 is subsequently permitted to aggregate in the developing solution or in a rinsing liquid or to precipitate due to a radical change of pH, the organic molecule 403 thus precipitated being subsequently permitted to re-adhere onto the surface of a resist

Figures 6, 7:
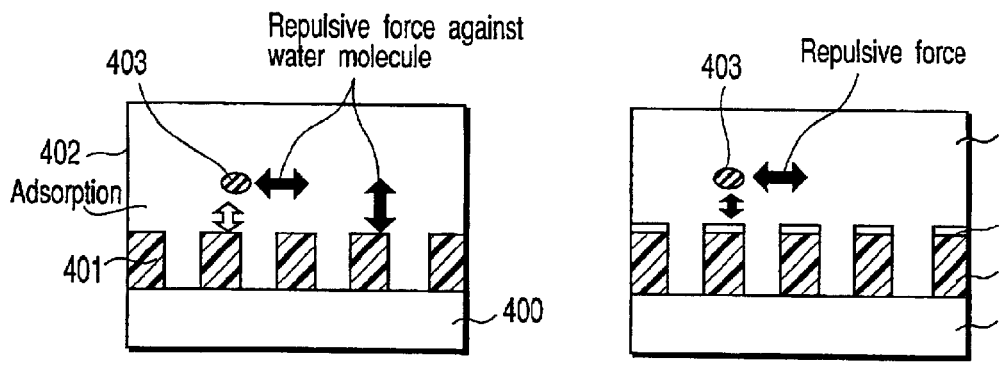
FIG. 6 shows a diagram illustrating a state where an organic molecule adheres onto the surface of resist film.
FIG. 7 shows a graph illustrating the function and effects to be obtained by the washing by means of the pretreatment using an aqueous solution of ozone.

401 as shown in FIG. 6, thus giving rise to the generation of defects. By the way, the reference numeral 400 in FIG. 6 denotes a substrate.

According to the prior art, it is required, for the purpose of removing the organic matter thus re-adhered, to employ a chemical liquid, to wash away the organic matter taking a long period of time, or to increase the number of repetition of washing process. The conventional method of removing the aforementioned defects is mainly focused on how to remove the defects that have been once adhered onto the resist, i.e. the generation of the defects is presumed, so that the conventional method is not aimed at an essential solution of the problem.

The generation of re-adhesion of organic matter is considered to occur according to the following mechanism. Namely, the particle of organic molecule (the main component of defects) that has been contained in the resist is known as generally exhibiting a high contact angle. The fact that the contact angle is high means that the energy at the interface between the organic particle and the molecule of liquid in pure water or in a developing solution is high. This means that when the molecule constituting the surface layer of the organic particle is existed neighboring the molecule of a rinsing liquid (water) or of a developing solution, the organic particle is energetically unstable. Therefore, the organic particle tends to move to an energetically more stable site. When the contact angle of the surface of resist is high, the energy at the interface between the surface of resist and water or a developing solution is also high and unstable. When the organic particle existing in a liquid comes close to the surface of the resist exhibiting a high contact angle, the molecule constituting the surface layer of the organic particle tends to come close to the surface of resist rather than come close to the water molecule or the molecule of the developing solution because of the reasons that it is more advantageous energetically and more stable. The molecule constituting the surface layer of the resist also tends to come close to the molecule of the organic particle rather than come close to the water molecule or the molecule of the developing solution because of the reasons that it is more stable energetically. As a result, the organic particle is caused to adhere onto the surface of the resist.

It has been confirmed that when the pretreatment is performed prior to the developing process by making use of an aqueous solution containing a low concentration of ozone according to this embodiment, the surface of the resist can be oxidized prior to the developing process, thereby lowering the contact angle thereof with respect to pure water as well as to the developing solution. Further, since the surface of the resist whose contact angle has been lowered by the aqueous ozone solution pretreatment is enabled to enhance the hydrophilicity thereof, when water molecule or the molecule of developing solution is placed close to the molecule constituting the surface of the resist, the energy at the interface can be lowered, thus rendering the surface of the resist more stable in energetical view point. Therefore, as shown in FIG. 7, when the organic particle 403 is moved close to the oxide layer 410 of the resist 401 in the developing solution 402, a trade-off will be presented as to which situation is energetically more advantageous, i.e. a situation where water molecule or the molecule of developing solution is placed close to the surface of the resist, or a situation where the molecule of organic particle is placed close to the surface of the resist. If the former situation is energetically more stable, the adhesion of the organic particle to the surface of the resist can be prevented. As a result, the generation of defect due to the re-adhesion of organic matter can be greatly minimized.

According to the aqueous ozone solution pretreatment in this embodiment, this trade-off is utilized in such a manner that the situation where water molecule or the molecule of developing solution is placed close to the surface of the resist becomes more stable than the situation where the molecule of organic particle is placed close to the surface of the resist, thereby making it possible to minimize the defects to be brought about by the adhesion of organic, matter. Since it is possible, according to the technique of this invention, to minimize the defects to be brought about by the adhesion of organic matter as compared with the conventional technique, the washing time can be greatly shortened. Additionally, this invention is more advantageous in environmental viewpoint as compared with the prior art in the respect that a chemical liquid is not required to be employed.

However, since the ozone remaining in water is permitted to diffuse into the air atmosphere, it is preferable to decompose ozone remaining in the aqueous ozone solution, provided that a large quantity of aqueous ozone solution is to be employed. The discharging of decomposed ozone can be preferably conducted by the means set forth in a fourth embodiment to be explained hereinafter.

Figure 8:
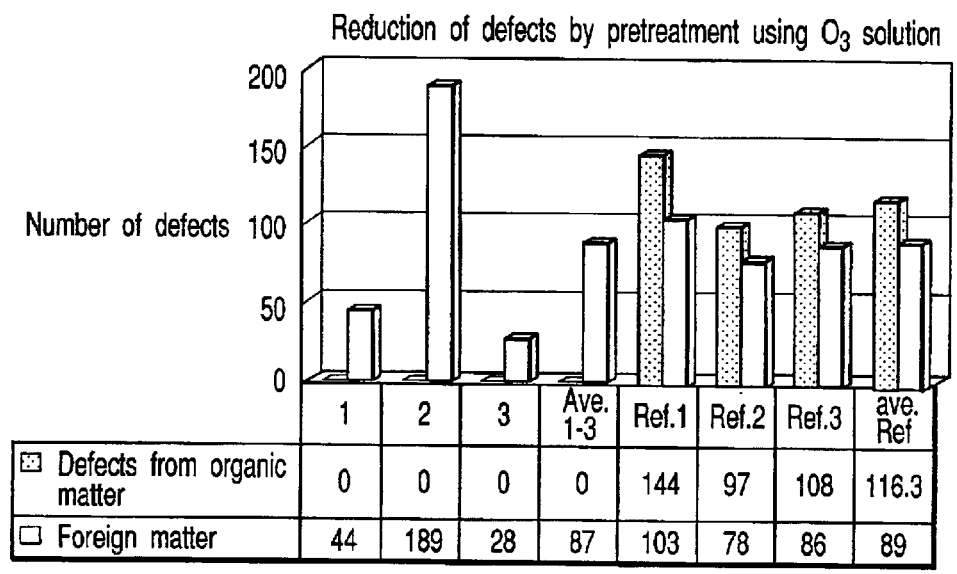
FIG. 8 shows a graph illustrating the results of the first embodiment demonstrating the reduction in number of defects after a developing process.

FIG. 8 shows the results demonstrating the reduction in number of defects after the developing process according to the method of this embodiment. It will be seen from these results that the defects due to the adhesion of organic matter that may become a fatal defect can be completely eliminated.

Figure 9:
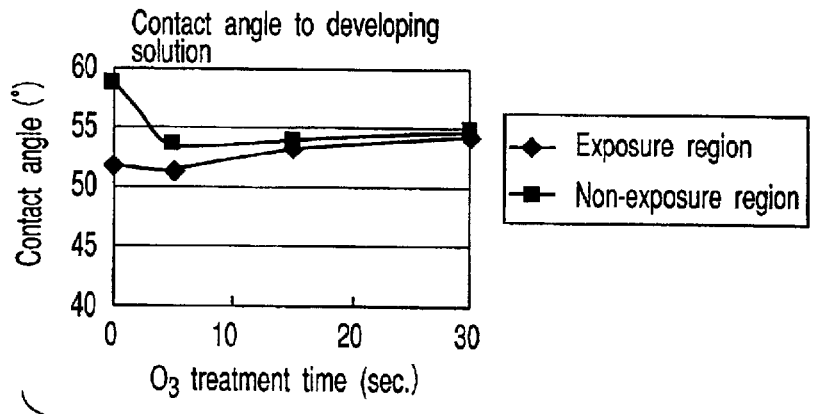
FIG. 9 shows a graph illustrating the relationship between the change in contact angle of developing solution and the treatment time using an aqueous ozone solution.
Figure 10:
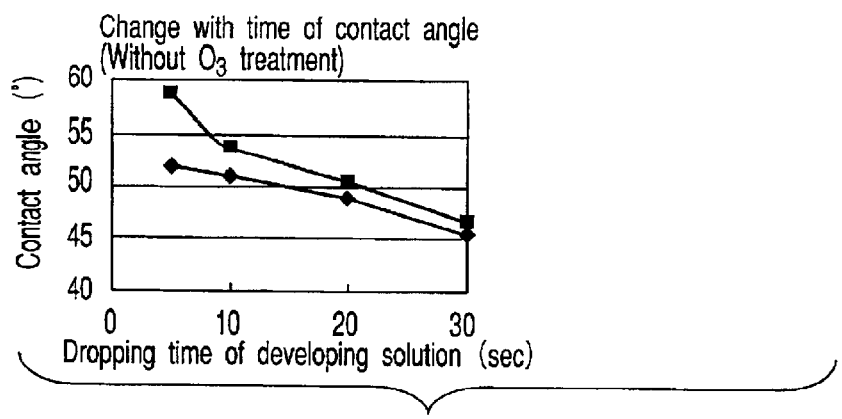
FIG. 10 shows a graph illustrating the relationship between the contact angle of a substrate which was not treated with an aqueous solution of ozone and the time elapsed from the moment when a developing solution was dropped.
Figure 11:
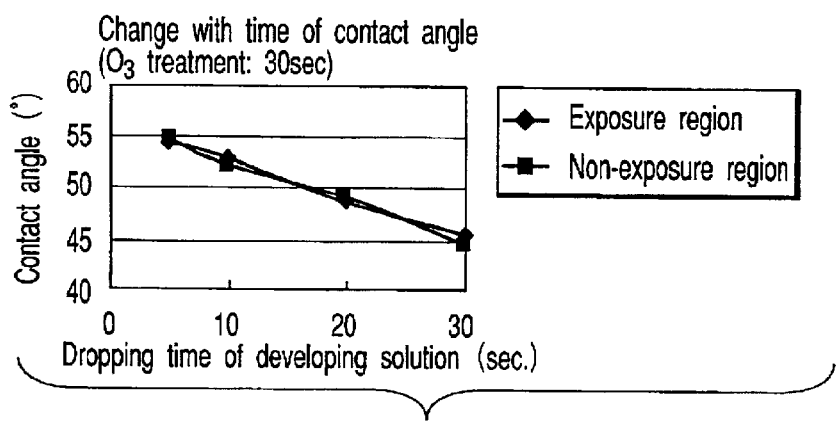
FIG. 11 shows a graph illustrating the relationship between the contact angle of a substrate which was treated with an aqueous solution of ozone for 30 seconds and the time elapsed from the moment when a developing solution was dropped.

Then, the contact angle of the resist film to a developing solution was measured on the substrate which was undergone a developing treatment according to the method of this embodiment, the results being illustrated in FIGS. 9, 10 and 11. Specifically, FIG. 9 shows the relationship between the change in contact angle of developing solution and the treatment time using an aqueous ozone solution. This measurement was performed not only on the exposure region but also on the non-exposure region. At the moment when the treatment time with the employment of the aqueous ozone solution was zero second, i.e. the substrate is not yet treated, the difference in contact angle between the exposure region and the non-exposure region was found slightly less than 10 degrees. However, the difference became almost zero after 15 seconds of the treatment.

FIG. 10 illustrates the relationship between the contact angle of a substrate which was not treated with an aqueous solution of ozone and the time elapsed from the moment when a developing solution was dropped, and FIG. 11 illustrates the relationship between the contact angle of a substrate which was treated with an aqueous solution of ozone for 30 seconds and the time elapsed from the moment when a developing solution was dropped. As shown in FIG. 10, when the substrate was not treated with an aqueous solution of ozone, although a difference in contact angle of about 10 degrees was recognized immediately after the dropping of the developing solution, this difference could be gradually decreased with time, but failing to minimize this difference to zero. On the other hand, as shown in FIG. 11, when the substrate was treated with an aqueous solution of ozone for 30 seconds, any difference in contact angle between the exposure region and the non-exposure region was not recognized immediately after the initiation of the dropping of the developing solution. Prominent effects of the aqueous ozone solution pretreatment according to this invention on the developing process was quantitatively demonstrated from the aforementioned results.

By the way, according to this embodiment, the concentration of ozone in the aqueous solution of ozone is set to 2 ppm, and the treatment time is set to 5 to 30 seconds. However, these values can be optionally varied so long as the concentration of ozone is such that it does not give a damage to the resist and it is capable of obtaining almost the same effects as those of this embodiment.

Further, although an aqueous solution of ozone is employed as an oxidative liquid in this embodiment, any other kinds of oxidative liquid which is incapable of invading the surface of a resist to a depth of 5 nm or more can be employed. For example, an aqueous solution containing oxygen or carbon monoxide, or a solution of hydrogen peroxide may be employed.

(A Second Embodiment)

The method of forming a resist film according to this embodiment will be explained with reference to FIGS. 12A through 12H.

Figure 12A:
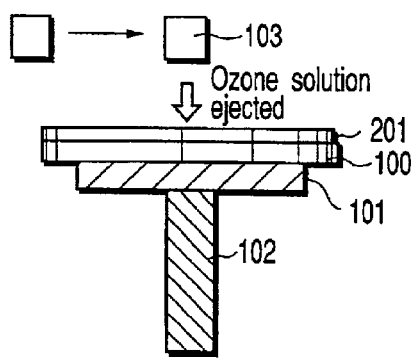
FIGS. 12A to 12H respectively shows a diagram illustrating in step-wise the process of forming a resist film according to a second embodiment.

First of all, as shown in FIG. 12A, a reflection preventive film and a chemical amplification type resist are successively coated on the surface of the substrate 100 and then, subjected to an exposure process of reduction projection wherein a desired pattern is transcribed, by making use of KrF excimer laser and through an exposure reticule, to the coated layer. Thereafter, the substrate 100 is heat-treated, transferred to a developing unit, and fixed to the anchoring table 101.

Figure 12B:

Then, in the same manner as in the first embodiment, an aqueous solution of ozone as low as 2 ppm in concentration of ozone is ejected from the chemical liquid-feeding nozzle 103 to thereby form an aqueous ozone solution film 201 on the surface of the substrate 100. Then, by allowing the entire surface of the substrate 100 to be contacted with the aqueous ozone solution film 201 for 5 to 30 seconds, the surface of the resist is permitted to be slightly oxidized (FIG. 12B).

Figure 12C:
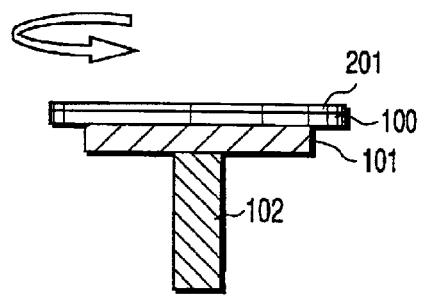

Then, the substrate 100 is rotated at a rotational speed of 500 rpm to 1000 rpm for 2 to 5 seconds to thereby shake off and remove most of the aqueous ozone solution film 201 formed on the surface of the substrate 100, thus permitting the aqueous ozone solution film 201 to remain at a thickness ranging from several microns to several tens microns on the surface of the substrate (FIG. 12C).

Figure 12D:
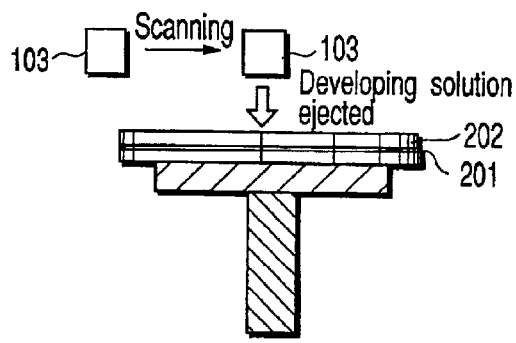
Figure 12G:
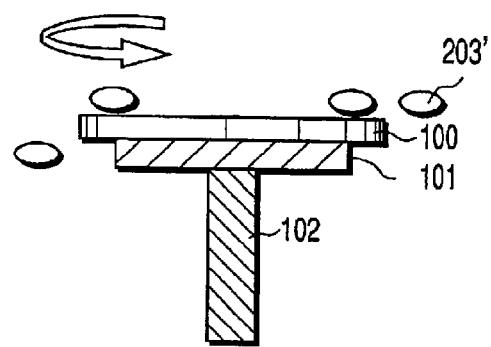

Thereafter, while permitting a developing solution to be ejected in a curtain-like manner from the chemical liquid-feeding nozzle 103, the chemical liquid-feeding nozzle 103 is scanned from one end of the substrate 100 to the other, thereby forming a developing solution film 202 having a thickness of about 500 $\mu$m on the surface of the substrate 100 (FIG. 12D).

Figure 12E:
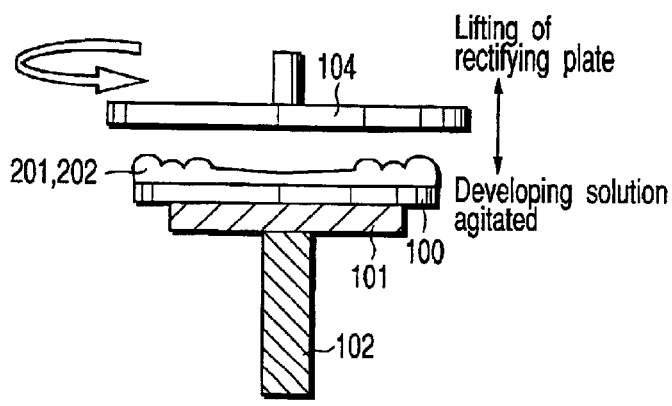

Next, the alkaline ion of the developing solution which has been inactivated by the aqueous ozone solution is removed, and at the same time, the agitation of the developing solution 202 and the aqueous ozone solution 201 existing on the surface of the substrate 100 is performed so as to prevent the dissolved products of resist which have been generated during the developing process from being locally stagnated (FIG. 12E). The agitation of the developing solution 202 and the aqueous ozone solution 201 can be performed by rotating the disk plate 104 having an air inlet hole at the center thereof, while keeping the disk plate 104 at a suitable height over the substrate 100.

After the elapse of time which is required for obtaining a desired pattern in the resist film, ultra-pure water is ejected from the chemical liquid-feeding nozzle 103 to the surface of the substrate 100 to thereby stop the developing process and concurrently wash away the developing solution, the dissolved products, etc. (FIG. 12F).

Figure 12H:
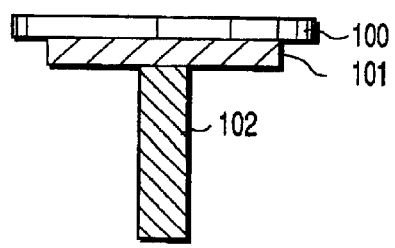
Figure 12F:
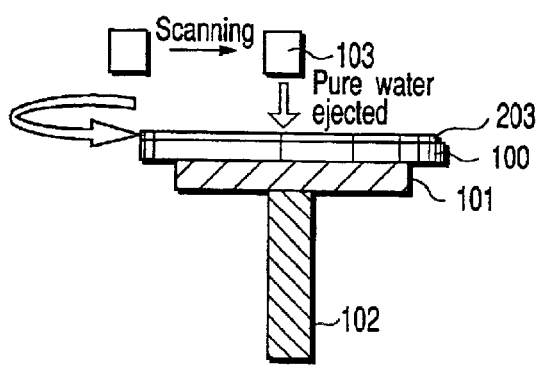

Then, after finishing a 10-second washing by making use of pure water, the pure water 203' existing on the surface of the substrate 100 is shaken off by rotating the substrate 100 at a high rotational speed, and then, the surface of the substrate 100 is permitted to dry (FIG. 12G), thus finishing the developing process (FIG. 12H).

By the way, according to this embodiment, although the disk plate 104 having an air inlet hole and disposed over the substrate 100 is employed as an agitating mechanism, any other kinds of agitating mechanism can be employed as long as they are capable of ensuring almost the same degree of effects. For example, it would be conceivable, as an alternative agitating mechanism, to obtain almost the same degree of effects by making use of a mechanism wherein the substrate 100 is caused to rotate so as to agitate the developing solution existing thereon, or a mechanism wherein an inert gas is ejected toward the surface of the substrate so as to agitate the developing solution existing thereon.

The effects in the developing process as well as in the washing step are the same as those of the aforementioned first embodiment. Further, since an aqueous ozone solution film is permitted to deposit to a thickness of several tens microns on the surface of the substrate at the initial stage of developing process, any difference in the developing process-initiating time on the surface of the substrate can be minimized. When a developing solution film is to be formed on the surface of the substrate by causing the nozzle to scan from one end of the substrate to the other end while permitting a developing solution to be ejected in a curtain-like manner from the chemical liquid-feeding nozzle, a difference in developing time would be generated between the scanning-initiating end and the scanning-terminating end on the surface of the substrate, thereby badly affecting the dimension of resultant pattern.

Therefore, when an aqueous solution film containing a low concentration of ozone which is capable of inactivating the alkaline ion of the developing solution is deposited in advance on the surface of the substrate, the alkaline ion can be inactivated by means of this ozone solution deposited on the substrate on the occasion of initiating the ejection of the developing solution to thereby retard the developing process-initiating time, and at the time of nearly terminating the ejection of the developing solution, the ozone solution existing on the surface of the substrate can be already inactivated by the alkali, thereby making it possible to minimize any difference in developing time that may be generated between the scanning-initiating end and the scanning-terminating end in the ejection of the developing solution.

Further, since an aqueous ozone solution film is deposited on the surface of the substrate and agitated during the developing process, the thickness of the developing solution film to be formed on the surface of the substrate may be as small as 500 $\mu$m or so, i.e. a thickness which enables a chemical liquid to effectively flow. Namely, the quantity of developing solution to be fed to the surface of the substrate can be minimized, and at the same time, the quantity of a chemical liquid to be employed can be also minimized.

By the way, according to this embodiment, the concentration of ozone in the aqueous solution of ozone is set to 2 ppm, and the treatment time is set to 10 seconds. However, these values can be optionally varied so long as the concentration of ozone is such that it is capable of obtaining almost the same effects as those of this embodiment.

(A Third Embodiment)

Since the method of forming a pattern according to this embodiment is the same as that of the aforementioned first embodiment, the drawings related to this embodiment are omitted herein.

First of all, a reflection preventive film and a chemical amplification type resist are successively coated on the surface of the substrate and then, subjected to an exposure process of reduction projection wherein a desired pattern is transcribed, by making use of KrF excimer laser and through an exposure reticule, to the coated layer. Thereafter, the substrate is heat-treated, transferred to a developing unit, and fixed to the anchoring table. In this embodiment, an aqueous solution containing ozone at a low concentration of 3 ppm (which concentration is higher than that of the aforementioned first and second embodiments) is ejected to entirely oxidize the surface of the substrate. Then, the substrate is rotated at a rotational speed of 2000 rpm to thereby shake off and remove the aqueous ozone solution film formed on the surface of the substrate.

Thereafter, while permitting a developing solution to be ejected in a curtain-like manner from the chemical liquid-feeding nozzle, the chemical liquid-feeding nozzle is scanned from one end of the substrate to the other, thereby forming a developing solution film on the surface of the substrate. After the elapse of time which is required for obtaining a desired pattern in the resist film, ultra-pure water is ejected from the chemical liquid-feeding nozzle to the surface of the substrate to thereby stop the developing process and concurrently wash away the developing solution, the dissolved products, etc. Then, after finishing a 10-second washing by making use of pure water, the substrate 100 is rotated at a high rotational speed, and then, the surface of the substrate is permitted to dry.

The effects in the developing process that can be derived from the aqueous ozone solution pretreatment are the same as those of the aforementioned first embodiment. This embodiment however has the following additional effects. Namely, according to this embodiment, since the concentration of ozone in the aqueous ozone solution is higher than that of the first embodiment, a larger number of molecules are oxidized at the surface of the resist by the aqueous ozone solution pretreatment as compared with the first embodiment, so that the ratio of decomposed polymer in the surface layer of the resist is also increased.

Figures 13A, 13B:
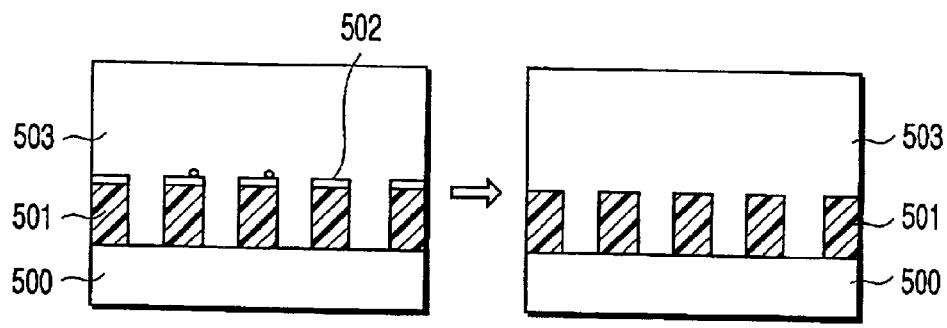
FIGS. 13A and 13B respectively shows a graph illustrating the function and effects to be obtained by the resist film-forming method according to a third embodiment.

As a result, as shown in FIGS. 13A and 13B, an alkaline developing solution is enabled, during the developing process, to penetrate into the surface layer of the non-exposure region of the surface of the resist, thereby permitting a swelled layer 502 to be slightly formed on the surface of the resist 501. At the stage of initiating the washing step using pure water following the developing process, the concentration of alkali is sharply lowered, thereby permitting the alkali existing in the swelled layer 502 formed on the surface of the resist to diffuse again into a rinsing liquid 503. Due to the force acting on this occasion, the swelled layer 502 constituting the surface layer of the resist 501 is permitted to peel off, thereby making it possible to entirely remove all of the defects that have been adhered onto the surface of the resist 501.

According to the prior art, it is impossible to completely dissolve a peeling-resistive layer which is adhered onto the surface of the resist 501 in the developing process, thus failing to remove defects several microns in size from the surface of the resist. Whereas, according to this embodiment, the existence of such a residual defect on the surface of the resist cannot be recognized at all.

According to this embodiment, the concentration of ozone in the aqueous solution of ozone is set to 3 ppm, and the treatment time is set to 5 to 30 seconds. However, these values can be optionally varied so long as the concentration of ozone is such that it simply allow a slight degree of swelling in the surface of the resist, but does not give any more damage to the resist and it is capable of obtaining almost the same effects as those of this embodiment.

In the following example, an embodiment related to the method of disposing a chemical liquid that has been employed in the substrate will be explained.

(A Fourth Embodiment)

It is known that the conventional developing step in a lithography process is accompanied with the problem that on the occasion of feeding a developing solution to the main surface of a substrate, the developing solution is caused to flow, or the developing process is caused to retard due to a difference in surface condition between the exposure region and the non-exposure region that have been formed in the preceding step, thereby deteriorating the dimensional precision of worked substrate. There is also a problem that due to the dissolved products to be generated in the process of etching a thin film by means of a developing solution, defects are caused to generate to thereby deteriorate the yield of product.

In order to overcome these problems, it is proposed, as set forth in the previous embodiment, to minimize a difference of surface conditions by permitting the surface of the thin film to be contacted with an aqueous ozone solution containing ozone. It is also adopted a method wherein the pattern formed through a developing process is contacted with an aqueous ozone solution to thereby oxidize and remove the dissolved products that have been adhered onto the thin film. Although the employment of an aqueous ozone solution is very useful in the developing process, there are problems that the piping disposed on the downstream side of the developing step is eroded, and that if the aqueous ozone solution is permitted to flow as a waste into a river, the environments would be badly affected.

As for the method of decomposing ozone, Jpn. Pat. Appln. KOKAI Publication No. 2000-125535 suggests a method wherein an alkaline chemical is added to a waste ozone solution. This method however is accompanied with a problem that ozone may be allowed to disperse from the waste ozone solution into the air atmosphere prior to the addition of the alkaline chemical, so that it cannot be said that the method is capable of completely decomposing ozone.

In the following embodiment, the method of disposing a waste liquid of ozone solution after the aqueous ozone solution pretreatment is explained with reference to FIGS. 14A through 14H. The aqueous ozone solution pretreatment referred to in following embodiment is not limited to the aforementioned first, second and third embodiments.

This embodiment is related to a process wherein an organic photosensitive resin film is formed on a main surface of silicon substrate as a masking material for working an underlayer in the manufacturing process of semiconductor device, and subsequently, the organic photosensitive resin film is selectively worked.

A chemical amplification type resist having a sensitivity to ArF (wavelength: 193 nm) was employed for the photosensitive resin film, and a pattern for forming a wiring (wiring pattern) was transcribed to this photosensitive resin film by means of an ArF exposure apparatus, the patterned layer being subsequently subjected to a heat treatment at a temperature of 130° C. subsequent to the exposure process thereof.

Figure 14A:
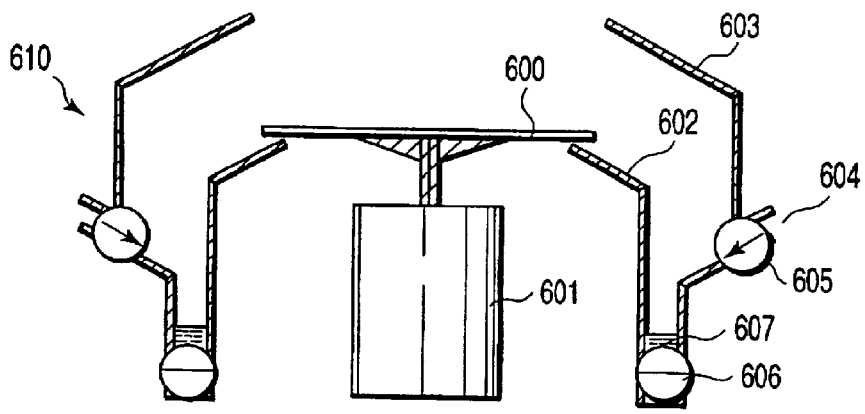
FIGS. 14A to 14I respectively shows a diagram illustrating in step-wise the process of disposing the waste liquid of an aqueous solution of ozone according to a fourth embodiment.

As shown in FIG. 14A, a substrate 600 was mounted on the substrate-holding member 601 of developing apparatus. This substrate-holding member 601 was provided with a rotating mechanism so as to enable the substrate 600 to rotate. Around this substrate 600, there was disposed a cup consisting of an inner cup 602 and an outer cup 603. This cup was provided with an alkaline developing solution-feeding port 604 and with a valve 605 for controlling the feeding of an alkaline developing solution into the cup. The cup was further provided with a valve 606 for discharging a solution which had been collected at the bottom of the cup.

Since there is a great difference in affinity to a developing solution between the exposure region and the non-exposure region of the chemical amplification type resist, it was expected that if the developing process was performed as it was, the movement of developing solution may be caused to generate due to the aforementioned difference in affinity to the developing solution on the occasion of feeding a developing solution, thereby deteriorating the uniformity of final dimension and at the same time, fluctuating the dimension due to a difference in area of exposure. Therefore, the surface of the resist film was slightly oxidized by making use of an aqueous ozone solution prior to the feeding of a developing solution, thus performing a first aqueous ozone solution pretreatment step for minimizing the difference in affinity between the exposure region and the non-exposure region.

When the aqueous ozone solution that has been employed in the aforementioned surface oxidation is permitted to flow, as it is, into a drainage pipe, ozone is expected to be generated inside the drainage pipe, thereby badly affecting other apparatuses which are communicated with this drainage pipe. Therefore, under the condition where the valve 606 was closed, the valve 605 was opened, and an alkaline developing solution was introduced into the cup from the outer cup 605 side so as not to contact with the substrate 600 thereby permitting the alkaline developing solution to flow via the alkaline developing solution-feeding port 604 into the bottom of the cup, thus forming a pool of the alkaline developing solution 607.

Figure 14B:
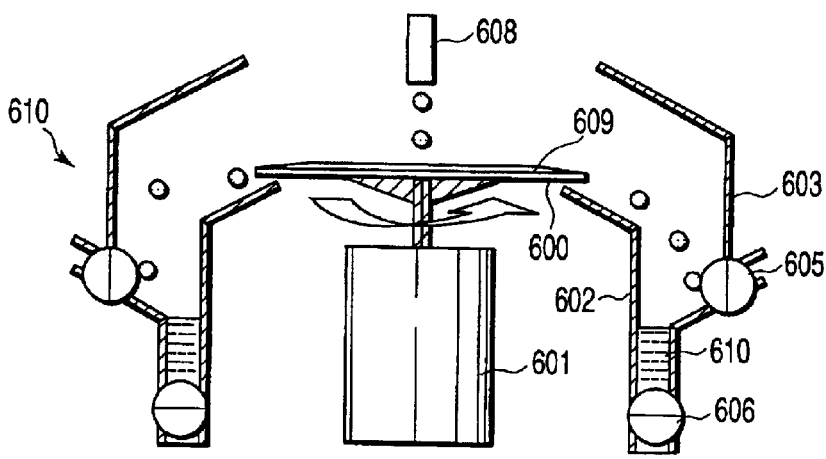

Then, as shown in FIG. 14B, the valve 605 was closed, and a 2 ppm aqueous ozone solution 609 was fed from an ozone solution-feeding nozzle 608 onto the main surface of the substrate 600 while the substrate 600 was kept rotating by means of the rotating mechanism of the substrate-holding member 601. The aqueous ozone solution 609 fed in this manner onto the main surface of the substrate 600 was acted to reform the main surface of the substrate 600 and then, discarded via the outer peripheral portion of the substrate 600 and the wall of the inner cup 602 into the cup so as to be dropped into the pool of the alkaline developing solution 607. Although the ozone to be released into the atmosphere inside the cup was 0.5 ppm or so in concentration, it was possible to immediately decompose the ozone that has been released into the atmosphere inside the cup by the effects of the vapor (mist) emitted from the pool of the alkaline developing solution 607. Further, since the alkaline developing solution was strongly alkaline (pH=13.8 or so), the concentration of ozone in the aqueous ozone solution thus dropped into the pool was decreased down to 0.2 ppm within one second.

Figure 14C:
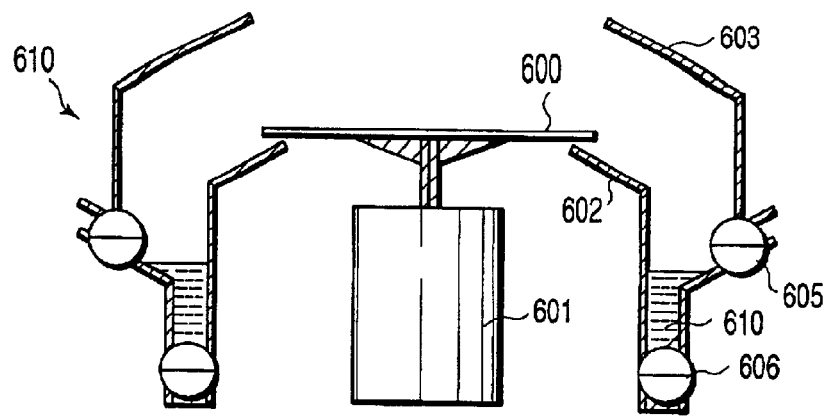
Figure 14D:
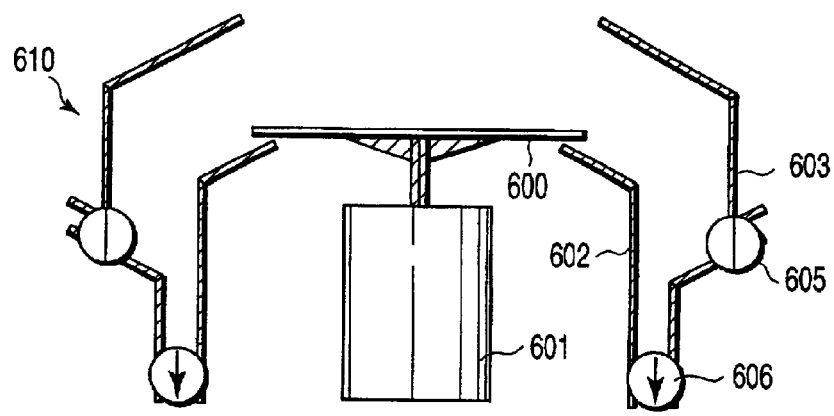

After finishing the first aqueous ozone solution pretreatment, the substrate 600 was rotated at a high speed so as to permit the residual ozone solution on the main surface of the substrate 600 to be received in the cup, and after being left to stand for 3 seconds (the concentration of ozone was reduced to $\frac{1}{1000}$ of the initial concentration: FIG. 14C), the valve 606 was opened to thereby permit a developing solution 613 containing the inactivated ozone solution (i.e. most of the ozone was decomposed into oxygen) to be discharged into the drainage pipe (FIG. 14D).

Figure 15:
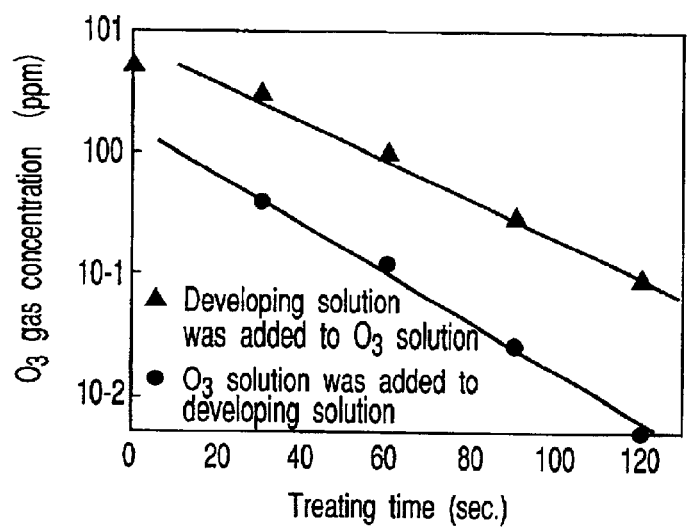
FIG. 15 shows a graph illustrating the relationship between the time and the changes in concentration of ozone gas in an aqueous solution of ozone which was mixed with a developing solution.
Figure 16:
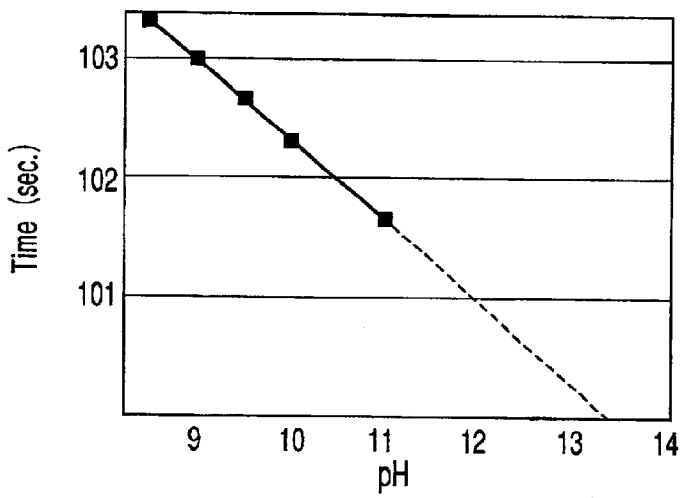
FIG. 16 shows a graph illustrating the relationship between pH and the time required for decreasing the concentration of residual ozone down to $\frac{1}{10}$.

FIG. 15 illustrates the changes in concentration of ozone gas with time (dependency on the mixing order: aqueous ozone solution vs developing solution (pH=13.8)). As shown in FIG. 15, it will be clear from the comparison of mixing orders, i.e. the comparison of the mixing order (the conventional method) wherein a developing solution was added to an aqueous ozone solution with the mixing order wherein an aqueous ozone solution was added to a developing solution (the method of the present embodiment), that the method of the present embodiment is more advantageous in shortening the treatment time. By the way, the aforementioned standing time (3 seconds) was determined by referring to FIG. 15. Further, FIG. 16 illustrates the relationship between pH and the time required for decreasing the concentration of residual ozone down to $\frac{1}{10}$.

Figure 14E:
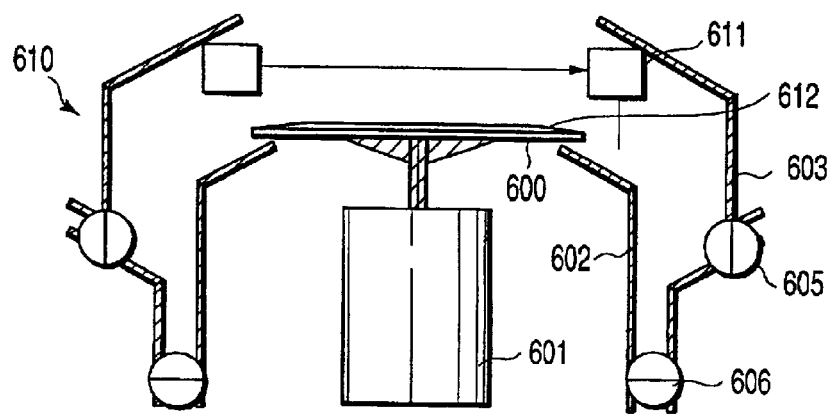
Figure 14F:
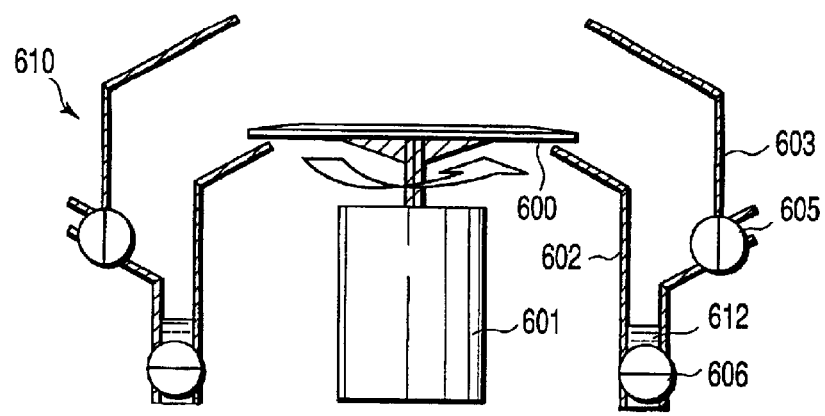

Then, as shown in FIG. 14E, a developing solution 612 was fed from a developing solution-feeding nozzle 611 onto the main surface of the substrate 600. On this occasion, with a view to wash again the main surface of the substrate 600 by making use of an aqueous ozone solution after finishing the developing process, the valve 606 disposed at a lower portion of the cup was closed so as to enable the developing solution that had been once used to be accumulated at a lower portion of the cup. The developing process was performed for a period of 60 seconds.

Figure 14G:
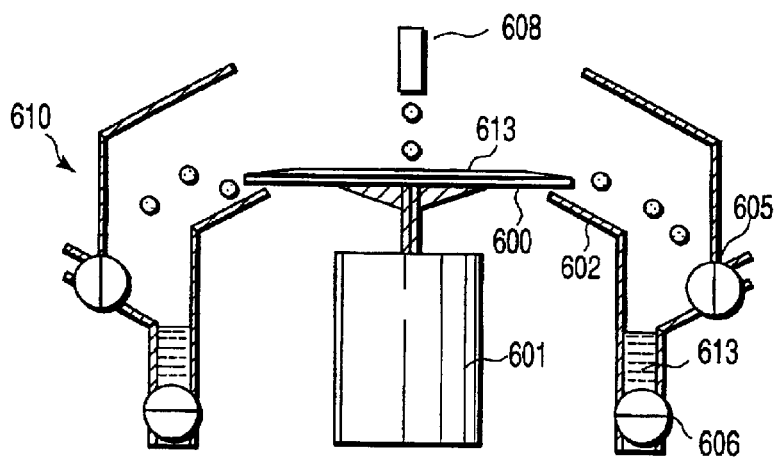
Figure 14H:
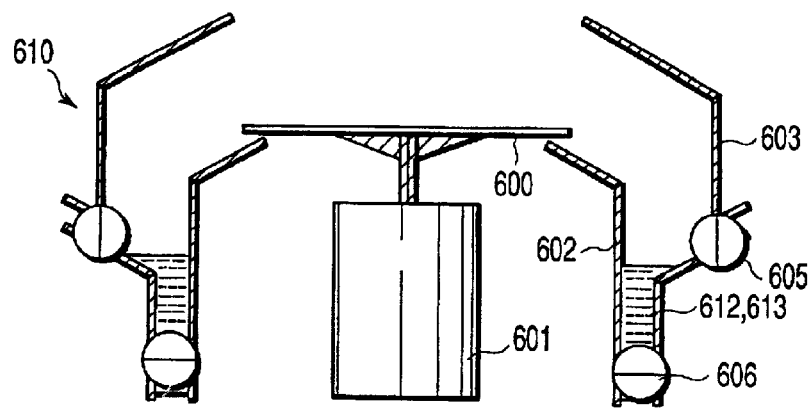
Figure 14I:
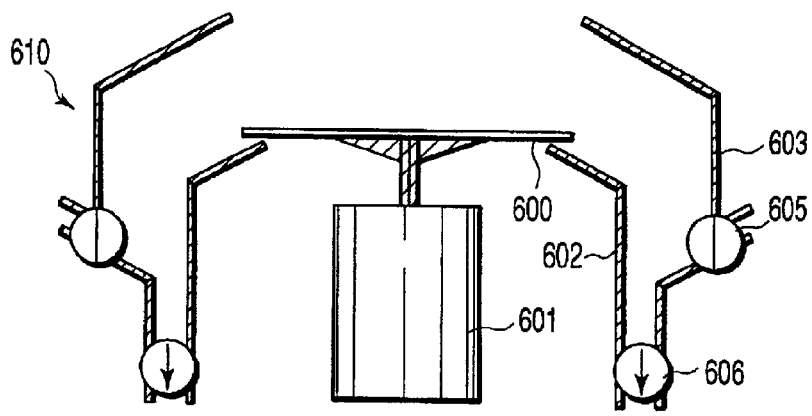

Then, the substrate 600 was rotated so as to shake off the developing solution, the developing solution thus shaken off being permitted to accumulate at the bottom of the cup (FIG. 14F), and at the same time, an aqueous ozone solution 613 was fed from the ozone solution-feeding nozzle 608 onto the main surface of the substrate 600 (a second aqueous ozone solution pretreatment step) (FIG. 14G). This aqueous ozone solution 613 was employed for the purpose of removing the dissolved products and the swelled layer which had been adhered onto the surface of chemical amplification type positive resist pattern which was formed on the main surface of the substrate 600 by the developing process. This aqueous ozone solution 613 which was employed for washing the surface of the substrate 600 was allowed to flow out of the main surface of the substrate and discarded via the outer peripheral portion of the substrate 600 into the pool of used developing solution 612, which was accumulated in advance at a lower portion of the cup as shown in FIG. 14H. Since the pH of the used developing solution 612 was 13 or so, it was capable of sufficiently decomposing the ozone contained in the aqueous ozone solution 613. Therefore, the ozone which was released into the air atmosphere inside the cup was enabled to be contacted with and decomposed by the mist of the used developing solution 612 in the cup. At the same time, the ozone which was contained in the discarded aqueous ozone solution 613 was permitted to decompose within several seconds. Then, as shown in FIG. 14I, the valve 606 disposed at a lower portion of the cup is opened, thereby permitting the decomposed ozone solution 613 to be discharged together with the used developing solution 612 into a drainage pipe.

It was possible, through these processes, to form a wiring pattern having a width of 110 nm on the main surface of the substrate, the wiring pattern being excellent in dimensional precision and substantially free from any defects. Further, the resultant wiring pattern was dry-etched to form a wiring pattern excellent in electric properties. Since all of the ozone employed in this series of steps was substantially completely decomposed within the cup, it was possible to perform the treatment of the ozone without releasing the ozone into the external environment.

According to this embodiment, after finishing the second aqueous ozone solution pretreatment step, the valve 606 was opened so as to permit the waste liquid to be discarded. However, if it is desired to perform a continuous treatment, it may be more advisable to keep the valve 606 in a closed state so as to accumulate and preserve the waste liquid until the first aqueous ozone solution pretreatment step of the next substrate is finished, thereby making it possible to reduce not only the quantity of the developing solution to be employed in the second aqueous ozone solution pretreatment step of the following substrate to be treated, but also the quantity of waste liquid to be discarded, thus minimizing any adverse effects to the environment.

According to this embodiment, a developing solution-feeding line communicating with the interior of the cup is separately provided. However, the feeding of a developing solution can be performed in various ways. For example, it is possible to feed a developing solution from over the cup by shifting the developing solution-feeding nozzle. Further, the ozone-feeding system as well as the developing solution-feeding system can be variously modified other than the aforementioned systems. For example, various kinds of developing solution-feeding nozzle, various kinds of rinsing liquid-feeding nozzle, and various kinds of ozone solution-feeding nozzle, all of which are already published, can be employed together with the feeding methods thereof. Additionally, the location of the valve communicating with a drainage pipe may be also modified in various ways other than that shown in the drawings so long as it is possible to suitably form a pool of liquid.

According to this embodiment, although an aqueous ozone solution was employed in the steps before and after the step of feeding a developing solution, the aqueous ozone solution may not be employed in such a manner. For example, if a difference in affinity to a developing solution is relatively small between the exposure region and the non-exposure region, the first aqueous ozone solution pretreatment step may not be performed. Further, if the adhesion of dissolved products to a resist pattern is hardly recognized after the developing process, the second aqueous ozone solution pretreatment step may not be performed.

Although this embodiment is directed to one example wherein the method of this invention is applied to a step involving the irradiation of ArF excimer laser, this invention is not limited to such an example. For example, the method of this invention can be also applied to a developing process for a resist film which can be employed in an exposure process using a KrF excimer laser (248 nm) or an F2 excimer laser (157 nm), or in a high-acceleration/a low-acceleration electronic beam exposure, an X-ray exposure or an EUV exposure.

By the way, as shown in FIG. 15, the release of ozone into the air atmosphere varies prominently depending on the mixing order of chemical liquids. If an aqueous ozone solution is existed in advance, since the dispersion of ozone is initiated from the aqueous ozone solution into the air atmosphere, the concentration of ozone may become very high prior to the feeding of alkali, or the ozone thus released in the air atmosphere may be left remained in a somewhat stable state even though the ozone would be gradually decomposed. However, if alkali is present in advance, and the vapor pressure of the alkali is relatively high as in the case of tetra-ammonium hydroxide (TMAH) which is employed in this embodiment, since alkali is permitted to exist in the atmosphere, the ozone that has been released into the air atmosphere due to a physical shock generated on the occasion of pouring an aqueous ozone solution can be decomposed by the alkali existing in advance in the air atmosphere. At the same time, the ozone in an aqueous ozone solution can be also decomposed by alkali, thereby making it possible to effectively decompose the ozone in an used aqueous ozone solution as set forth in this embodiment.

The treatment as described above would not be limited to the decomposition of an aqueous ozone solution to be employed in a developing process, but can be applied to any other kinds of process using an aqueous ozone solution.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern comprising:
    coating a photosensitive resist film on a surface of substrate;
    subjecting said photosensitive resist film to an exposure process;
    coating an oxidizing liquid having an oxidative effect on a surface of said photosensitive resist film that has been subjected to said exposure process to thereby perform a pretreatment wherein the surface of said resist film is caused to oxidize by said oxidizing liquid to form an oxide layer thereon;
    feeding a developing solution to said photo-sensitive resist film whose surface has been oxidized to thereby perform a development of said resist film; and
    feeding a rinsing solution to a surface of said substrate to wash said substrate.

2. The method according to claim 1, wherein said pretreatment is performed until contact angles of said developing solution and said rinsing liquid to said photosensitive resist film are decreased.

3. The method according to claim 1, wherein said oxidizing liquid is an aqueous solution containing at least one kind of material selected from the group consisting of ozone, oxygen, carbon monoxide and hydrogen peroxide.

4. The method according to claim 1, wherein said pretreatment is performed in a manner that said oxide layer formed does not extend not larger than 5 nm in depth-wise direction of said resist film.

5. The method according to claim 4, wherein said oxidizing liquid is an aqueous solution of ozone 5 ppm or less in concentration of ozone.

6. The method according to claim 1, wherein said pretreatment is performed in a manner that the surface of said photosensitive resist film is oxidized to form said oxide layer without causing the decomposition of a polymer constituting said resist film.

7. The method according to claim 1, wherein said pretreatment is performed in a manner that an invaded layer where a polymer constituting said resist film within said oxide layer is decomposed by said oxidizing liquid is permitted to extend less than 5 nm in depth-wise direction of said resist film; and said developing solution is allowed to impregnate into said invaded layer on the occasion of feeding said developing solution over the surface of said photosensitive resist film, thereby forming a swelled layer, which is subsequently peeled off by feeding said rinsing liquid to the surface of said substrate.

8. The method according to claim 1, feeding a developing solution to said photosensitive resist film is performed in a manner wherein said developing solution is ejected from a developing solution-ejecting nozzle to the surface of said photosensitive resist film, and concurrently, said substrate is moved relative to said developing solution-ejecting nozzle to thereby form a film of said developing solution.

9. The method according to claim 1, wherein the oxidizing liquid which has been fed to the surface of said photosensitive resist film is removed, and the surface of said substrate is permitted to dry.

10. The method according to claim 1, wherein a liquid layer consisting of oxidizing liquid which has been coated is made into a thin film; and the film of said developing solution is formed under a condition where said liquid layer has been made into said thin film.

11. The method according to claim 1, wherein following the formation of said film of developing solution, said film of developing solution is agitated.

12. A method of disposing a chemical liquid comprising:
    feeding an alkaline solution to a chemical liquid-retaining portion which is disposed outside a substrate having a thin film formed on a main surface thereof;
    feeding an aqueous solution of ozone to a main surface of said substrate to thereby reform a surface of said thin film, said aqueous solution of ozone which has been employed in the reforming being subsequently introduced into said chemical liquid-retaining portion where said alkaline solution is retained;
    decomposing ozone of said aqueous solution of ozone that has been introduced into said chemical liquid-retaining portion by making use of said alkaline solution retained in said chemical liquid-retaining portion; and
    discharging said alkaline solution and said aqueous solution of ozone where ozone has been decomposed from said chemical liquid-retaining portion.

13. A method of forming a pattern comprising:
    feeding an alkaline solution to a chemical liquid-retaining portion which is disposed outside a substrate having a thin film formed on a main surface thereof;

feeding an aqueous solution of ozone to a main surface of said substrate to thereby reform a surface of said thin film, said aqueous solution of ozone which has been employed in the reforming being subsequently introduced into said chemical liquid-retaining portion where said alkaline solution is retained;

decomposing ozone of said aqueous solution of ozone that has been introduced into said chemical liquid-retaining portion by making use of said alkaline solution retained in said chemical liquid-retaining portion;

feeding an alkaline solution to the main surface of said substrate which has been surface-modified to thereby selectively etch said thin film by making use of said alkaline solution, said alkaline solution employed in said etching being subsequently retained in said chemical liquid-retaining portion; and discharging said alkaline solution and said aqueous solution of ozone where ozone has been decomposed from said chemical liquid-retaining portion.

14. A method of forming a pattern comprising:

feeding an alkaline solution to a main surface of a substrate having a thin film formed on a main surface thereof to thereby selectively etch said thin film by making use of said alkaline solution;

retaining said alkaline solution which has been employed for said etching in a chemical liquid-retaining portion disposed outside said substrate;

feeding an aqueous solution of ozone to a main surface of said substrate which has been etched to thereby wash the main surface of said substrate, said aqueous solution of ozone which has been employed in the washing being subsequently introduced into said chemical liquid-retaining portion;

decomposing ozone of said aqueous solution of ozone that has been introduced into said chemical liquid-retaining portion by making use of said alkaline solution retained in said chemical liquid-retaining portion;

drying said substrate which has been washed; and discharging said alkaline solution and said aqueous solution of ozone where ozone has been decomposed from said chemical liquid-retaining portion.

15. A method of forming a pattern comprising:

feeding an alkaline solution to a chemical liquid-retaining portion which is disposed outside a substrate having a thin film formed on a main surface thereof;

feeding an aqueous solution of ozone to a main surface of said substrate to thereby reform a surface of said thin film, said aqueous solution of ozone which has been employed in the reforming being subsequently introduced into said chemical liquid-retaining portion where said alkaline solution is retained;

feeding an alkaline solution to the main surface of said substrate where said thin film has been reformed to thereby selectively etch said thin film by making use of said alkaline solution, said alkaline solution employed in said etching being subsequently retained in said chemical liquid-retaining portion;

exposing the main surface of said substrate where said thin film has been etched to said aqueous solution of ozone to thereby wash the main surface of said substrate, said aqueous solution of ozone which has been employed in said washing being subsequently introduced into said chemical liquid-retaining portion;

decomposing ozone of said aqueous solution of ozone that has been introduced into said chemical liquid-retaining portion by making use of said alkaline solution retained in said chemical liquid-retaining portion;

drying said substrate which has been dried; and discharging said alkaline solution and said aqueous solution of ozone where ozone has been decomposed from said chemical liquid-retaining portion.

\* \* \* \* \*

UNITED STATES PATENT AND TRADEMARK OFFICE
CERTIFICATE OF CORRECTION

PATENT NO. : 6,818,387 B2
DATED : November 16, 2004
INVENTOR(S) : Takahashi et al.

It is certified that error appears in the above-identified patent and that said Letters Patent is hereby corrected as shown below:

Title page,
Item [54], Title, change "OF" to -- FOR --.
Item [30], Foreign Application Priority Data, change "2000-040618" to -- 2001-040618 --.

Signed and Sealed this

Twenty-second Day of March, 2005

JON W. DUDAS
*Director of the United States Patent and Trademark Office*